United States Patent [19]

McMahon, Jr.

[11] Patent Number: 4,581,739

[45] Date of Patent: Apr. 8, 1986

[54] ELECTRONICALLY SELECTABLE REDUNDANT ARRAY (ESRA)

[75] Inventor: Maurice T. McMahon, Jr., Poughkeepsie, N.Y.

[73] Assignee: International Business Machines Corporation, Armonk, N.Y.

[21] Appl. No.: 597,958

[22] Filed: Apr. 9, 1984

[51] Int. Cl.$^4$ .............................................. G06F 11/20
[52] U.S. Cl. ......................................... 371/21; 371/10
[58] Field of Search .................... 371/7, 8, 11, 21, 10, 371/25; 364/200, 900; 365/200, 190, 210; 324/73 R, 73 AT

[56] References Cited

U.S. PATENT DOCUMENTS

| | | | |
|---|---|---|---|
| 3,222,653 | 12/1965 | Rice | 364/200 |
| 3,434,116 | 3/1969 | Anacker | 364/200 |
| 3,633,175 | 1/1972 | Harper | 364/200 |
| 3,772,652 | 11/1973 | Hilberg | 364/200 |
| 3,783,254 | 1/1974 | Baxter | 364/700 |
| 3,845,476 | 10/1974 | Boehm | 365/1 |
| 3,868,646 | 2/1975 | Bergman | 364/200 |
| 3,898,443 | 8/1975 | Smith | 371/10 |
| 3,992,702 | 11/1976 | Bailey | 365/1 |
| 3,995,261 | 11/1976 | Goldberg | 365/1 |
| 4,310,901 | 1/1982 | Harding | 371/8 |
| 4,376,300 | 3/1983 | Tsang | 371/10 |
| 4,412,327 | 10/1983 | Fox | 371/21 |
| 4,429,389 | 1/1984 | Cahiller | 371/21 |
| 4,450,559 | 5/1984 | Bond | 371/10 |
| 4,460,997 | 7/1984 | Harns | 371/21 |
| 4,460,999 | 7/1984 | Schmidt | 371/21 |
| 4,475,194 | 10/1984 | LaVallee et al. | 371/10 |
| 4,488,298 | 12/1984 | Bond | 371/11 |
| 4,523,313 | 6/1985 | Nibby | 371/10 |

OTHER PUBLICATIONS

"Redundant Memory Cell and Decoder" by N. F. Brickman, IBM Technical Disclosure Bulletin, vol. 13, No. 7, Dec. 1970, p. 1924.

"Redundant Bit Line Decode Circuit" by S. E. Schuster, IBM Technical Disclosure Bulletin, vol. 14, No. 5, Oct. 1971, p. 1513.

"Redundant Bit Line Decode Circuit" by J. L. Chu et al., IBM Technical Disclosure Bulletin, vol. 18, No. 6, Nov. 1975, p. 1777.

"Redundancy Scheme for Array Chips" by F. Haist et al., IBM Technical Disclosure Bulletin, vol. 19, No. 3, Aug. 1976, p. 964.

"Memory System with High-Performance Word Redundancy" by B. F. Fitzgerald et al., IBM Technical Disclosure Bulletin, vol. 19, No. 5, Oct. 1976, p. 1638.

"Address Skip-A Means for Utilizing Imperfect Storage" by F. E. Sakaley, IBM Technical Disclosure Bulletin, vol. 20, No. 5, Oct. 1977, p. 1841.

"Effective Scheme for Utilizing Partially Good Chips in Memory System" by G. G-C. Liu, IBM Technical Disclosure Bulletin, vol. 20, No. 8, Jan. 1978, p. 3009.

"Use of Partially Good Memory Chips" by R. F. Meyers et al., IBM Technical Disclosure Bulletin, vol. 21, No. 9, Feb. 1979, p. 3582.

"Module Personalization for Partially Good Chip Utilization" by R. Peters, IBM Technical Disclosure Bulletin, vol. 21, No. 11, Apr. 1979, p. 4535.

"Electronic Reorganization of Memory for Handling Uncorrectable Memory Errors" by A. V. Stays et al., IBM Technical Disclosure Bulletin, vol. 22, No. 12, May 1980, p. 5378.

"Redundancy Scheme for Embedded Arrays" by R. Brosch et al., IBM Technical Disclosure Bulletin, vol. 23, No. 1, Jun. 1980, p. 213.

(List continued on next page.)

Primary Examiner—Michael R. Fleming
Attorney, Agent, or Firm—Wesley DeBruin

[57] ABSTRACT

The disclosure is directed to an electronically selectable redundant array or memory technique and circuitry. More particularly the invention utilizes Level Sensitive Scan Design (LSSD) circuitry with limited modification to perform the additional function of selecting a redundant word (or words) in a memory chip containing at least one defective word. The correction mechanism is independent of which word line (or word lines) is bad, and is therefore independent of I/O pin (or pad) connection of the array chip.

12 Claims, 9 Drawing Figures

OTHER PUBLICATIONS

"Semiconductor Memory Redundancy at the Module Level" by B. F. Fitzgerald et al., IBM Technical Disclosure Bulletin, vol. 23, No. 8, Jan. 1981, p. 3601.

"Storage Array with Bad Bit Bypass" by W. W. Wu, IBM Technical Disclosure Bulletin, vol. 23, No. 8, Jan. 1981, p. 3761.

"Redundant Circuit Personalization at the Module Level" by J. P. Coullahan et al., IBM Technical Disclosure Bulletin, vol. 23, No. 9, Feb. 1981, p. 4168.

"Passivation Process for Semiconductor Device with Fusible Link Redundancy" by D. E. Davis et al., IBM Technical Disclosure Bulletin, vol. 23, No. 10, Mar. 1981, p. 4451.

"Redundancy Programming with Threshold Shift" by B. F. Fitzgerald et al., IBM Technical Disclosure Bulletin, vol. 24, No. 7B, Dec. 1981, p. 3809.

"Memory Data Steering On-Chip Switching and Off-Chip Control Network" by J. R. Cavaliere et al., IBM Technical Disclosure Bulletin, vol. 24, No. 9, Feb. 1982, p. 4779.

"Dynamic Allocation of Redundant Memory Components" by F. J. Aichelmann et al., IBM Technical Disclosure Bulletin, vol. 24, No. 9, Feb. 1982, p. 4776.

"Dynamic Selection of Partial Good Array Chips by Bit Address Selection" by L. J. Bosch et al., IBM Technical Disclosure Bulletin, vol. 25, No. 3B, Aug. 1982, p. 1485.

SYMBOLIC REPRESENTATION OF SHIFT REGISTER LATCH (SRL)

FIG. 1

IMPLEMENTATION OF SRL OF FIG. 1 IN AND-INVERT GATES

FIG. 2

CHIP WITH FOUR INTERCONNECTED SRL'S

FIG. 3

SYMBOLIC REPRESENTATION OF SRL WITH GATED WORD PORT

FIG. 4

IMPLEMENTATION OF FIG. 4 IN AND-INVERT GATES

FIG. 5

SYMBOLIC REPRESENTATION OF SHIFT REGISTER LATCH (SLR)
WITH ADDED REDUNDANT WORD PORT

IMPLEMENTATION OF FIG. 6 IN AND—INVERT GATES

FIG. 7

ELECTRONICALLY SELECTABLE REDUNDANT ARRAY (ESRA)

FIELD OF INVENTION

The invention is directed to an electronically selectable redundant array or memory technique and circuitry. More particularly the invention utilizes Level Sensitive Scan Design (LSSD) circuitry with limited modification to perform the additional function of selecting a redundant word (or words) in a memory chip containing at least one defective word. The correction mechanism is independent of which word line (or word lines) is bad, and is therefore independent of I/O pin (or pad) connection of the array chip.

REFERENCE IS MADE TO THE FOLLOWING PENDING U.S. PATENT APPLICATIONS

U.S. patent application Ser. No. 280,050 entitled "Electronic Chip-In Place Test (ECIPT) Structure and Method" filed Mar. 31, 1980 by P. Goel and M. T. McMahon, Jr. and of common assignee with the subject application, granted as U.S. Pat. No. 4,441,075 on Apr. 3, 1984.

U.S. patent application Ser. No. 625,426 entitled "Improved Gate Array Chip" filed June 28, 1984 by E. F. Culican, M. C. Graf and L. C. Richie and of common assignee with the subject application.

U.S. patent application Ser. No. 336,004 entitled "Memory Array with Switchable Upper and Lower Word Lines", filed Dec. 30, 1981 by R. W. Knepper and of common assignee with the subject application, granted as U.S. Pat. No. 4,460,984 on July 17, 1984.

The afore identified U.S. patent applications, Ser. No. 280,050, Ser. No. 625,426 and Ser. No. 336,004, are incorporated herein by reference thereto to the same and full extent as though expressly set forth herein.

BACKGROUND OF THE INVENTION AND PRIOR ART

The manufacturing process for semiconductor read/write arrays (Random Access Memories) of n bits by m words has typically used some form of redundancy as a yield enhancement mechanism. In most cases, the redundancy mechanism is invoked after final functional test of the array and results in the array chip being assigned a specific part number depending on which bit is bad.

In the case where, for example, a 256× [array is desired, the array would be fabricated as a 256×9 structure and offered as 9 different part numbers. The part numbers would consist of either all original 8 words used or as any 1 of 8 combinations where the redundant ninth word is substituted for 1 of the 8 original words. Since the assignment of the array chip I/O pads is dependent on the particular word that is bad, the part numers are not interchangeable, except in the case of an all good chip.

If an array of this type fails in the field, it is not possible to substitute a good word for a bad word without physically replacing the chip.

The following patents and publications are directed to redundancy techniques for memory arrays. It is to be appreciated that the following art is not submitted to be the only, the best, or the most pertinent art.

PATENTS

U.S. Pat. No. 3,222,653 entitled "Memory System For Using a Memory Despite the Presence of Defective Bits Therein" granted Dec. 7, 1965 to R. Rice.

U.S. Pat. No. 3,434,116 entitled "Scheme For Circumventing Bad Memory Cells" granted Mar. 18, 1969 to W. Anacker.

U.S. Pat. No. 3,633,175 entitled "Defect-Tolerant Digital Memory System" granted Jan. 4, 1972 to S. D. Harper.

U.S. Pat. No. 3,772,652 entitled "Data Storage System With Means For Eliminating Defective Storage Locations" granted Nov. 13, 1973 to W. Hilberg.

U.S. Pat. No. 3,783,254 entitled "Level Sensitive Logic Systems" granted Jan. 1, 1974 to E. B. Eichelberger.

U.S. Pat. No. 3,845,476 entitled "Monolithic Memory Using Partially Defective Chips" granted Oct. 29, 1974 to R. F. Boehm.

U.S. Pat. No. 3,868,646 entitled "Memory Device with Standby Memory Elements" granted Feb. 25, 1975 to R. G. Bergman.

U.S. Pat. No. 3,989,443 entitled "Memory Fault Correction System" granted Aug. 5, 1975 to R. M. Smith.

U.S. Pat. No. 3,992,702 entitled "Code Conversion Arrangements For Addresses to Faulty Memory Locations" granted Nov. 16, 1976 to N. R. H. Bailey.

U.S. Pat. No. 3,995,261 entitled "Reconfigurable Memory" granted Nov. 30, 1976 to J. Goldberg.

PUBLICATIONS

[IBM Technical Disclosure Bulletin (IBM TDB)]

"Redundant Memory Cell and Decoder" by N. F. Brickman, IBM TDB Vol. 13, No. 7, December 1970, page 1924.

"On-Chip Redundancy Scheme" by S. E. Schuster, Vol. 14, No. 5, October, 1971 page 1513.

"Redundant Bit Line Decode Circuit" by J. L. Chu et al, IBM TDB Vol. 18, No. 6, November, 1975, page 1777.

"Redundancy Scheme for Array Chips" by F. Haist et al, IBM TDB Vol. 19, No. 3, August, 1976, page 964.

"Memory System with High-Performance Word Redundancy" by B. F. Fitzgerald et al, IBM TDB Vol. 19, No. 5, October, 1976, page 1638.

"Address Skip-A Means for Utilizing Imperfect Storage" by F. E. Sakalay, IBM TDB Vol 20, No. 5, October, 1977, page 1841.

"Effective Scheme For Utilizing Particularly Good Chips in Memory System" by G. G-C. Liu, IBM TDB Vol 20, No. 8, January, 1978, page 3009.

"Use of Partially Good Memory Chips" by R. F. Meyers et al, IBM TDB Vol 21, No. 9, February, 1979, page 3582.

"Module Personalization for "Partially Good" Chip Utilization" by R. McPeters, IBM TDB Vol 21, No. 11, April, 1979, page 4535.

"Electronic Reorganization of Memory For Handling Uncorrectable Memory Errors" by A. V. Staya et al, IBM TDB Vol. 22, No. 12, May, 1980, page 5378.

"Redundancy Scheme For Embedded Arrays" by R. Brosch et al, IBM TDB Vol 23, No. 1, June, 1980 page 213.

"Semiconductor Memory Redundancy at the Module Level" by B. F. Fitzgerald et al, IBM TDB Vol. 23, No. 8, January, 1981, page 3601.

"Storage Array with Bad Bit Bypass" by W. W. Wu, IBM TDB Vol 23, No. 8, January, 1981, page 3761.

"Redundant Circuit Personalization at the Module Level" by J. P. Coullahan et al, IBM TDB Vol. 23, No. 9, February, 1981, page 4168.

"Passivation Process for Semiconductor Device with Fusible Link Redundancy" by D. E. Davis et al, IBM TDB Vol. 23, No. 10, March, 1981, page 4451.

"Redundancy Programming with Threshold Shift" by B. F. Fitzgerald et al, IBM TDB Vol. 24, No. 7B, December, 1981, page 3809.

"Memory Data Steering On-Chip Switching and Off-Chip Control Network" by J. R. Cavaliere et al, IBM TDB Vol. 24, No. 9, February, 1982, page 4779.

"Dynamic Allocation of Redundant Memory Components" by F. J. Aichelmann, Jr. et al, IBM TDB Vol. 24, No. 9, February, 1982, page 4776.

"Dynamic Selection of Partial Good Array Chips By Bit Address Selection" by L. J. Bosch et al, IBM TDB Vol. 25, No. 3B, August, 1982, Page 1485.

SUMMARY OF THE INVENTION

The Electronically Selectable Redundant Array (ESRA) is a semiconductor array structure that provides for electronic selection of a redundant word within the array. The mechanism to select the redundant word uses a shift register latch (SRL) structure and can be invoked at any time during the life of the array.

A mechanism is therefore provided to electronically replace any bad word in an array with a redundant word. The I/O connections of the array chip remain unaltered and are independent of which word line is bad.

If all words in the array, including the redundant word, are initially good, the SRL mechanism can be used in a machine environment to repair a failed word without replacing the chip, any time during the life of the machine.

BRIEF DESCRIPTION OF THE DRAWING

The foregoing and other objects, features and advantages of the invention will be more apparent from the following more particular description of the preferred embodiment of the invention, as illustrated in the accompanying drawings.

DESCRIPTION OF THE INVENTION

Many known array chip designs use redundant words to increase yields. For instance $n \times m$ array can be designed with a $n \times m + 1$ bit arrangement. n and m may respectively be any positive integer, for example $n = 256$ and $m = 9$. If any m out of the $m + 1$ words is tested good, the array will be assigned a unique part number depending on which of the m words is good. In this case there are $m + 1$ different part numbers possible, including an all good array.

Each of the part numbers differ in the chip I/O assignment and are therefore not interchangeable at the next level of package except in the all good case. As the technology matures and yields increase, an increasing number of all good arrays are used where only partial good arrays are required.

In accordance with the invention it is assumed that all array chip outputs are driven from Shift Register Latches (SRL's) to meet the Level Sensitive Scan Design (LSSD) rules for array isolation. During normal operation of an array, only the L1 latch of the SRL is used to either store or gate each array output. The L2 latch is used in conjunction with the L1 latch of each SRL to scan out data during test and or diagnostic analysis. The data stored in the L2 latches after the scan out operation is not used during normal array operation.

The electronically Selectable Redundant Array (ESRA) concept can be used with a redundant array design to accomplish the following:
 (1) Use of partially good array chips without changing the I/O assignment.
 (2) Self repair in cases where initially all good array chips are used.

The implementation of ESRA requires the following mechanisms to be added to an array design:
 (1) Each L1 latch associated with an output driver will require an additional redundant word data port. The data input will be driven by the redundant word line (output of redundant word storage means) and the gate input will be driven by the associated L2 inverted output (L2) (See for example FIG. 8).
 (2) The redundant word input requires gating such that: (a) incoming data is routed to all of the good words (m storage means) and (b) incoming data to a bad word is routed to the redundant word (redundant word storage means).

Figure 8:
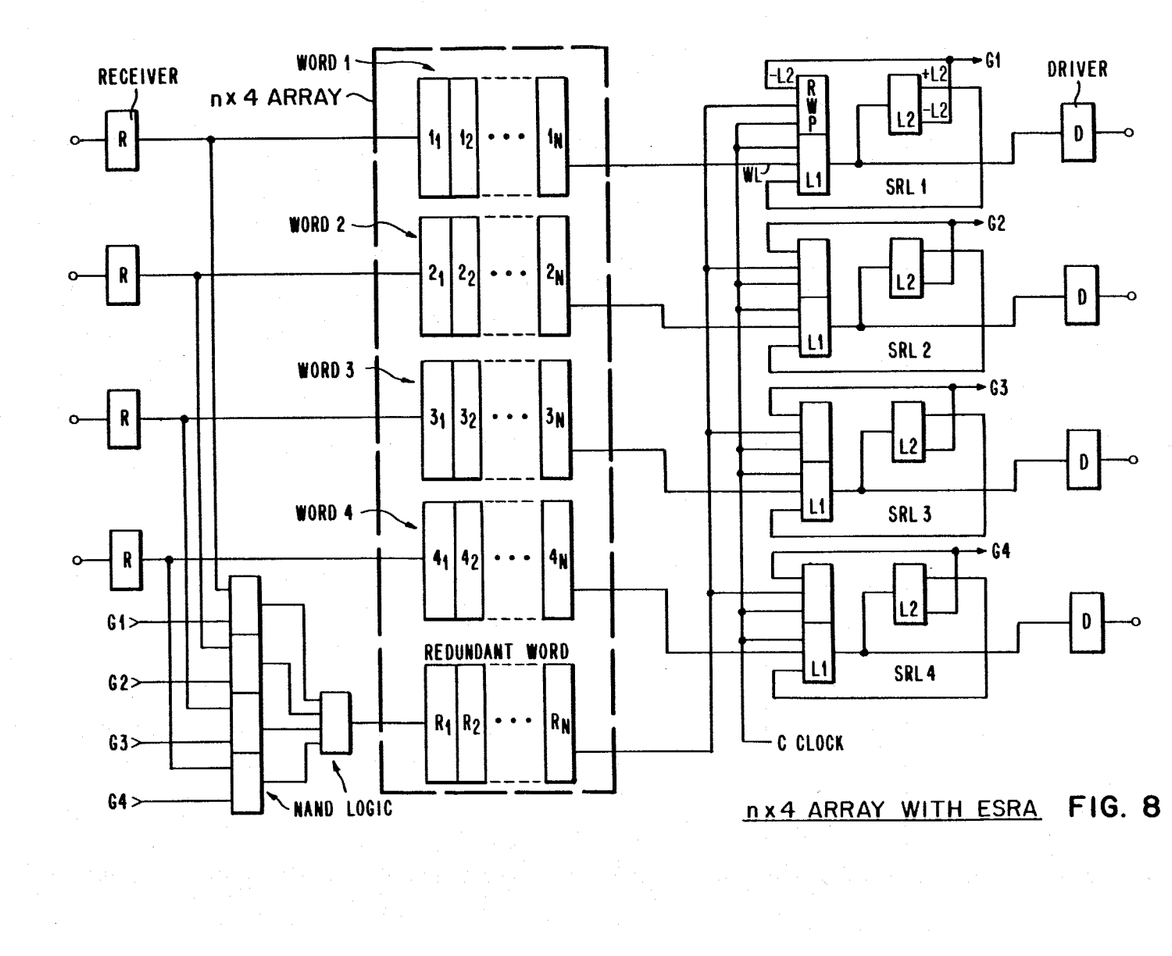
FIG. 8 is an illustrative block diagram depicting an electronically selectable redundant array in accordance with the invention.

An example of a two logic level gating scheme is shown in FIG. 8 whereby each array input signal is gated by the corresponding L2 output. Anytime that a particular L2 output is at a logical 1 level, the array input associated with that L2 output will be gated into the redundant word storage means.

Note: None of the SRL scan connections or clocking A and B of the the SLR's in the scan mode are shown in FIG. 8. Also, none of the known normal array control connections are shown. Further the array in FIG. 8 is shown merely for convenience of explanation and illustration as n×4 array rather than n×m array.

The following example should illustrate how the redundant word selection mechanism works. Assume that word #2 in FIG. 8 has a failing bit.

Step 1—The array output gate line (c clock) is brought to a 0 state. The L1 latches will now only accept new data from either the previous L2 stage or the chip LSSD input data I/O (scan input).

Step 2—a 1 . . . 1101 pattern is scanned into the L2 latches from the LSSD input data I/O (scan input) by pulsing the A and B clock inputs. [Assume that the data is scanned in from the top SRL in FIG. 8 to the bottom SRL].

The L2 latches associated with word lines 1, 3, 4, 5 6 . . . and m will now each contain a 0 state and the L2 latch associated with word line 2 will contain a 1 state.

The array is now configured as follows:
(1) The drivers associated with word lines, 1, 3, 4, 5, 6 . . . and m can only receive data from the standard word lines.
(2) The driver associated with word line 2 can only receive data from the redundant word line.
(3) The redundant word storage means will receive input data from the word #2 input I/O. [G1, G3, G4, G5, G6 . . . and Gm lines in FIG. 8 are at the 0 state, G2 line is at the 1 state.]

In the example shown the chip I/O designation will remain the same, but the redundant word storage means has been substituted for word storage means #2. The substitution was performed via the data shifted into the L2 latches from the LSSD input data I/O (scan input).

Before a particular ESRA can be used in a machine, it must be initialized to the proper configuration by shifting in the appropriate data as a machine bring up procedure. A unique set of data must therefore be cataloged with a unique part number for each possible array configuration. Each machine would require a unique initialization sequence unless all good array chips were used exclusively. If the self repair feature is used, a new machine initialization sequence must be generated.

PREFERRED EMBODIMENT OF THE INVENTION

Figure 1:
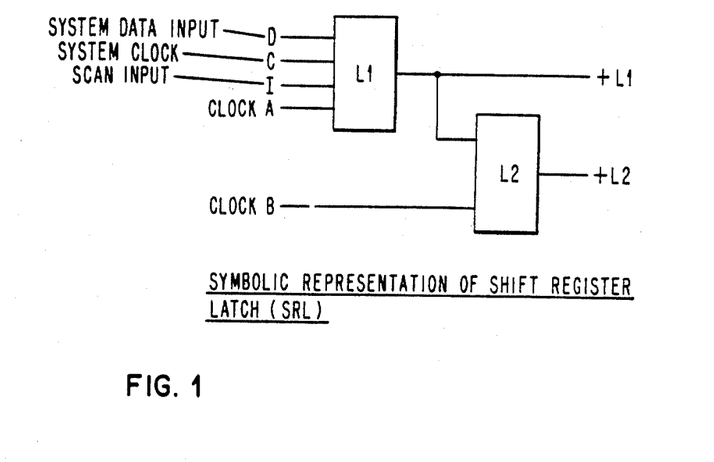
FIG. 1 is a symbolic representation of a shift register latch (SRL) in accordance with the known Level Sensitive Scan Design (LSSD) techniques and rules.
Figure 2:
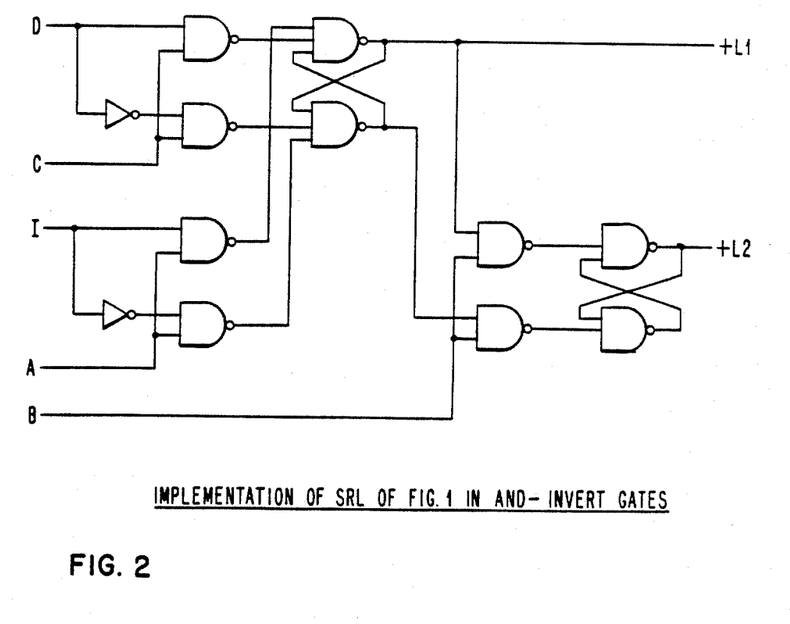
FIG. 2 an implementation of the SRL of FIG. 1 in AND INVERT gates.
Figure 3:
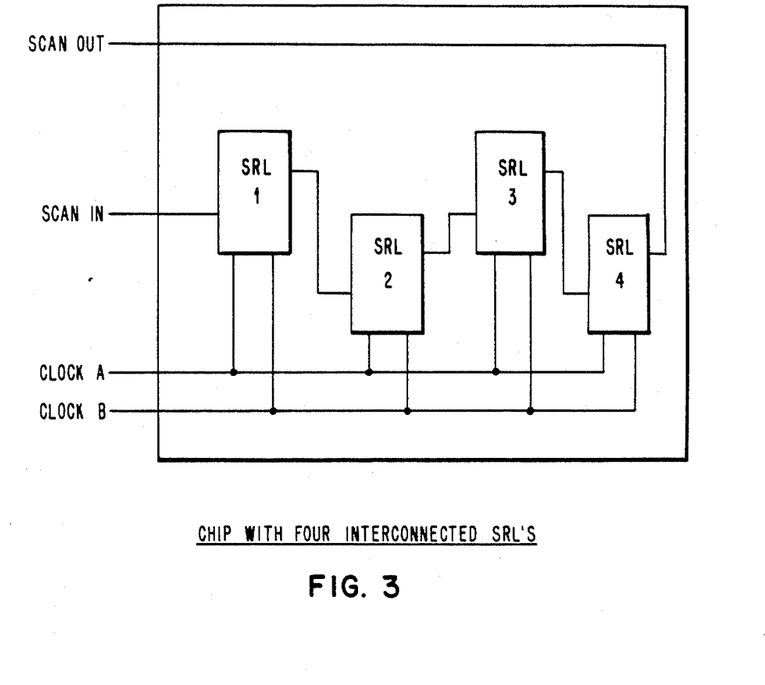
FIG. 3 is an integrated circuit chip having at least four interconnected shift register latches (SRL's) in accordance with the known Level Sensitive Scan Design (LSSD) techniques and rules.

ESRA employs a design structure in which shift register latches (SRL's) are employed as a word selection mechanism. FIG. 1 shows a schematic of an SRL. Generally, an SRL consists of a pair of latches—the L1 latch and the L2 latch. FIG. 2 discloses an implementation of the Shift Register Latch (SRL) of FIG. 1 in AND-INVERT gates. As in FIG. 3, any number of SRL's may be tied together to form a shift register. FIG. 3 discloses the interconnection of four SLR's contained on a single chip.

The L1 and L2 latches can have several data ports. Each data port is defined by a data input and a clock input such that when the clock input is pulsed, the logic state on the data input is stored in the latch. The L1 latch shown in FIG. 1 has a "scan" port with a scan data input (I) and a scan clock (A). The L2 latch of FIG. 2 also has a "scan" data port with its scan input connected to the output of the L1 latch and clock (B). The 4-stage shift register of FIG. 3 is formed by (i) connecting the A clock inputs of all SRL's to a unique external A clock chip pad (A), (ii) connecting the B clock inputs of all SRL's to a unique external B clock chip pad (B), (iii) connecting a unique chip input called the scan input (IN) to the I input of the first SRL in the shift register, and (iv) connecting the L2 output of the last SRL in the shift register to a unique chip pad called the scan output (OUT). Using the SCAN-IN, Clock A, Clock B SCAN-IN and SCAN-OUT chip pads, it is possible to preset (load) the shift register to any desired state or to observe (unload) the shift register state.

Figure 4:
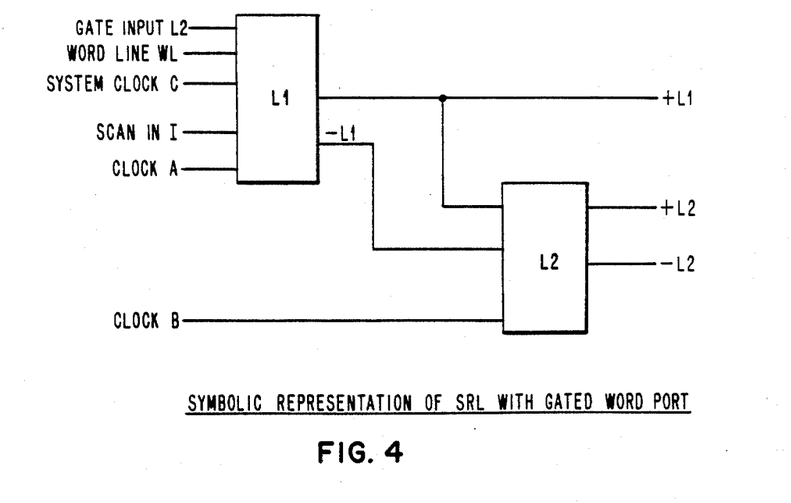
FIG. 4 is a symbolic representation of an SRL with a gated word port in accordance with the invention and known Level Sensitive Scan Design (LSSD) techniques and rules.
Figure 5:
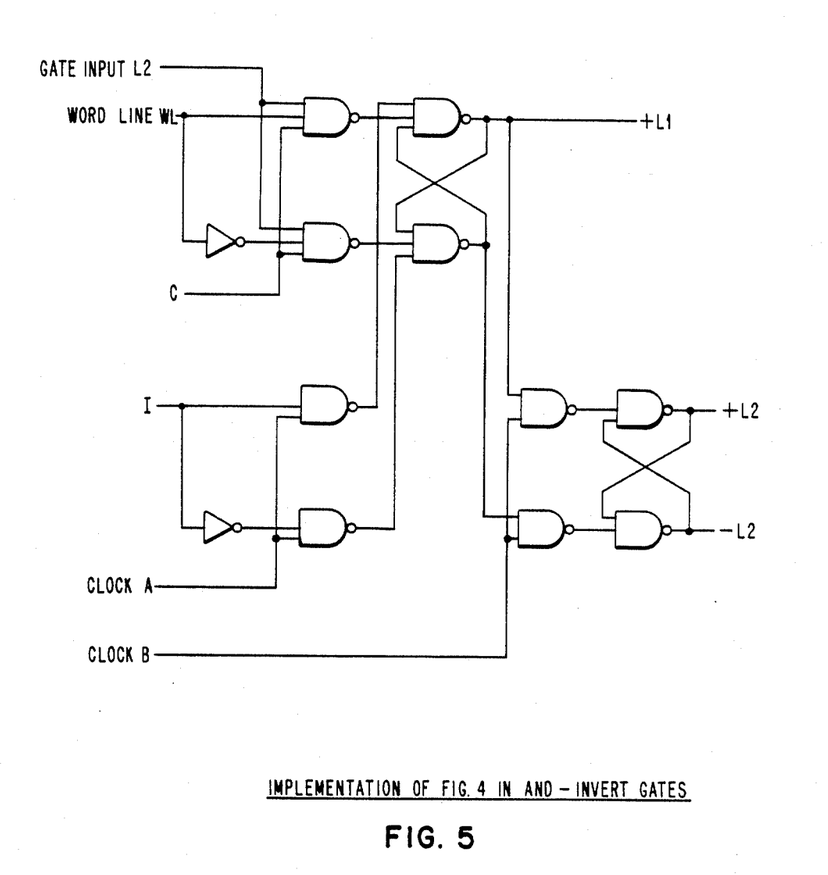
FIG. 5 is an implementation of the symbolic representation of the circuitry of FIG. 4 in AND-INVERT gates.

The scan ports of the L1 and L2 latches are generally used for test purposes only, i.e. to load or unload the individual SRL's as desired. The L1 and L2 latches can have additional data ports for system usage of the SRL's (as in the LSSD design). The data port is shown in FIG. 4 with the word line input (WL), system clock input (C), and gate input (L2). FIG. 5 discloses an implementation of the SRL of FIG. 4 in AND-INVERT gates.

Figure 6:
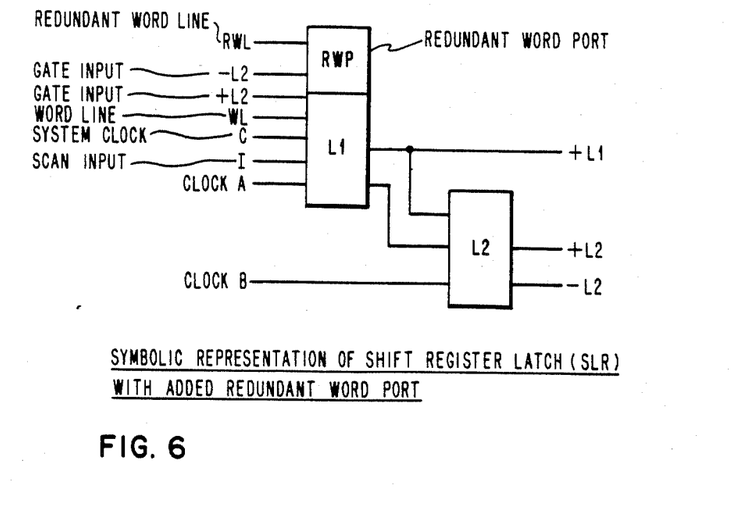
FIG. 6 is a symbolic representation of an SRL with a gated word port and a gated redundant word port in accordance with the invention and known Level Sensitive Scan Design (LSSD) techniques and rules.
Figure 7:
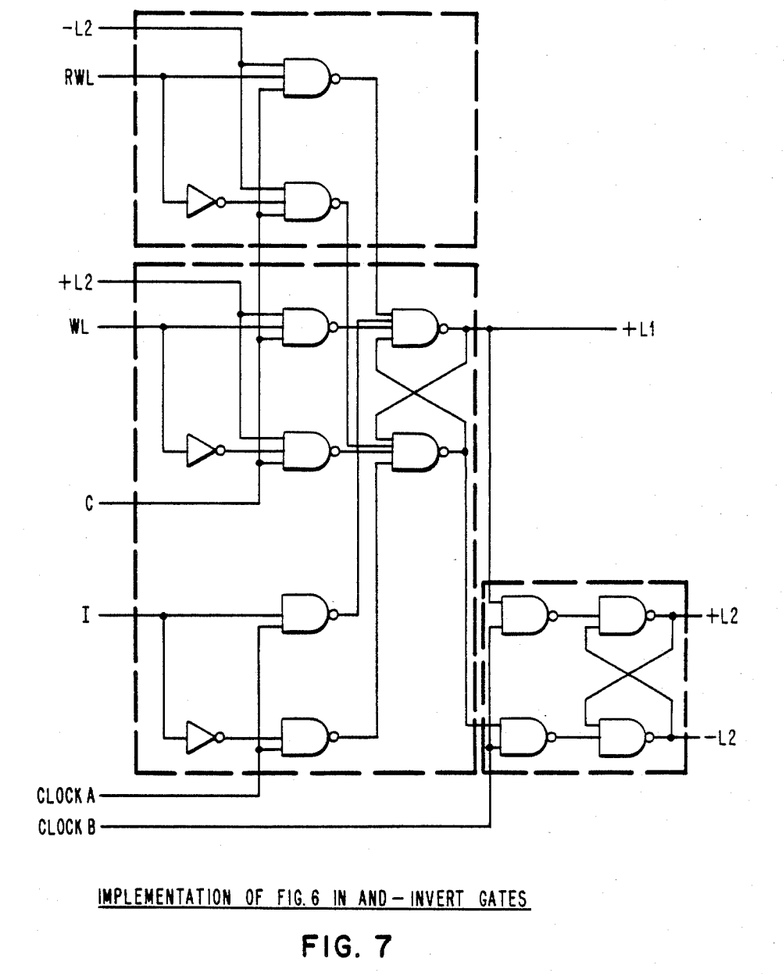
FIG. 7 is an implementation of the symbolic representation of the circuitry of FIG. 6 in AND-INVERT gates.

For implementation of ESRA, the L1 latch is capable of having a unique additional data port called the redundant word port. The redundant word port has a redundant word line input (RWL), a C clock input and a gate input (−L2) such that if the (−L2) input is at a logic 1 level, the outut of the L1 latch will be the same as the RWL input when the C clock is pulsed. The schematic and logic block implementation of the ESRA latch are shown in FIGS. 6 and 7.

The input to the redundant word storage means is controlled by logic gating that selects the appropriate word data input. The complementary output of the L2 latch (−L2) is used to provide the selection gating for the array data inputs. The logic gating is shown in FIG. 8 along with the overall ESRA logic. For purposes of illustration and explanation an n×4 array is used. The normal array decode, select and controls are omitted along with the LSSD scan connections since they are not affected by the ESRA concept.

For the structure shown in FIG. 8, assume that it has been determined that word #2 has at least 1 bad bit. Also assume that the SRL's are configured as in FIG. 3 with the SCAN IN feeding SRL #1 and the SCAN OUT being fed from SRL #4.

Figure 9:
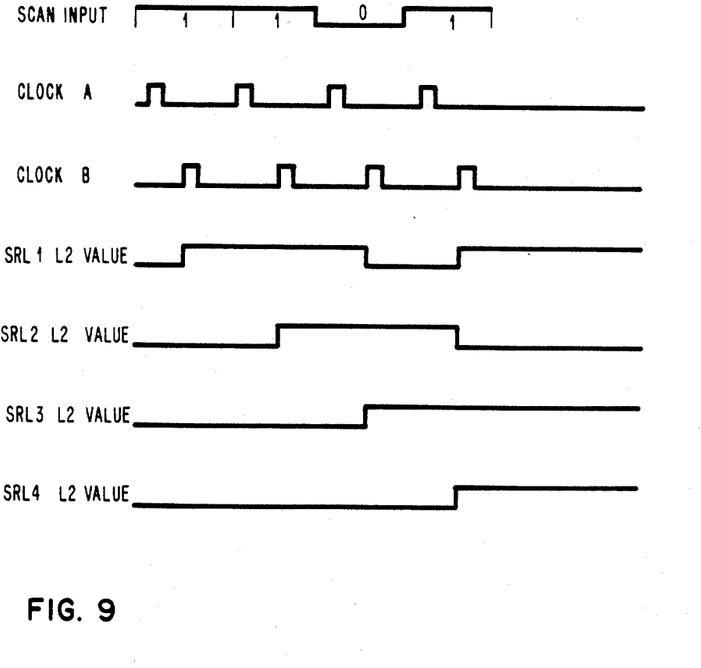
FIG. 9 shows A plurality of idealized waveforms to be viewed in conjunction with the explanation of the operation of the invention as shown by the illustrative block diagram of FIG. 8.

A 1101 sequence is propagated through the SRL string as shown in FIG. 9. At the end of the sequence, the L2 latch of SRL #1, 3 and 4 have a logic 1 value stored and the L2 latch of SRL #2 has a logic 0 value stored.

The redundant word storage means will now receive data from the receiver associated with word #2 and the L1 latch associated with word #2 will only accept data from the output of the redundant word storage means. Therefore, word storage means #2 has now been replaced by the redundant word storage means—as long as the 1101 sequence remains stored in the SRL string.

It is necessary, for any configuration of ESRA, that an initializing SRL sequence be applied before the array is used. Therefore any machine Using ESRA's must include the array initialization sequence as part of the machine bring up cycle. If an all good ESRA fails in the field, the initializing sequence would then be changed to overcome the defect.

While this invention has been particularly described with reference to the preferred embodiments thereof, it will be understood by those skilled in the art that the foregoing and other changes in form and details may be made therein without departing from the spirit and scope of the invention.

What is claimed is:

1. An integrated circuit containing an m×n read-/write memory array, wherein m×n are respectively positive integers and said memory array having the capacity to store m words, each of said words having n binary bits, said array including;

m storage means, each said m storage means having an input and an output, each of said m storage means having the capacity to store a word having n binary bits, at least one predetermined one of said m storage means being defective;

m memory array inputs, each of said m memory array inputs corresponding to one of said m storage means and connected to the input thereof;

at least one redundant storage means, each of said redundant storage means having an input and an output, each said redundant storage means having the capacity to store a word having n binary bits;

m memory array outputs, each of said m memory array outputs corresponding to one of said m storage means;

level sensitive scan design circuit means connected to said outputs of said m storage means, said output of said at least one redundant storage means and said m memory array outputs, said level sensitive scan design circuit means including means for storing a predetermined binary bit pattern, said predetermined binary bit pattern identifying the predetermined defective one of said m storage means;

logic circuit means having a first group of inputs, a second group of inputs and an output, said first group of inputs being selectively connected to said m inputs of said m storage means, said second group of inputs being selectively connected to said level sensitive scan design circuit means, said output of said logic circuit means being connected to said input of said redundant storage means, said logic circuit means being controlled by said predetermined binary bit pattern stored in said storage means of said level sensitive scan design circuit means, whereby said predetermined binary bit pattern is effective in causing the predetermined defective one of said m storage means to be replaced by said redundant storage means without any effect or modification on the function or designation of the m memory array inputs and m memory outputs.

2. An integrated circuit containing an m×n read/write memory array, as recited in claim 1, wherein said level sensitive scan design circuit means includes m shift register latches, each of said shift register latches being capable of storing at least one binary bit of data, said shift register latches being utilized to store said predetermined binary bit pattern.

3. An integrated circuit containing an m×n read/write memory array, as recited in claim 2, wherein said m shift register latches of said level sensitive scan design circuitry are connected into an m stage shift register having a scan input, a scan output and control circuitry for shifting said predetermined bit pattern into and out of said shift register.

4. An integrated circuit containing an m×n read/write memory array, as recited in claim 3, wherein each of said m shift register latch circuits includes interconnected first (L1) and second (L2) latch circuits and said predetermined binary bit pattern is stored in said m second (L2) latches of said m stage shift register.

5. An integrated circuit containing an m×n read/write memory array as recited in claim 4, wherein each of said m shift register latches includes interconnected first (L1) and second (L2) latch circuits, each of said m first (L1) latch circuits includes a word data port and a redundant word data port, and each of said m second (L2) latch circuits includes at least one data port.

6. An integrated circuit containing an m×n read/write memory array, as recited in claim 5, wherein each of said m first (L1) latch circuits has an output connected to a discrete one of said m memory array outputs, each of said m second (L2) latch circuits has a first output connected to said word data port of the first (L1) latch circuit contained within said same shift register latch as said second (L2) latch circuit each of said m second (L2) latch circuits has a second output connected to said redundant word data port of the first (L1) latch circuit contained within said same shift register latch as said second latch (L2) circuit.

7. An integrated circuit containing an m×n read/write memory array, as recited in claim 6, wherein each of said outputs of said m storage means is connected to the word data port of a predetermined one of said first (L1) latch circuits of said m stage shift register, and wherein said output of said redundant storage means is connected in common to the redundant word data port of each of said first (L1) latch circuits of said m stage shift register.

8. An integrated circuit containing an m×n read/write memory array, as recited in claim 7, wherein said first group of inputs of said logic circuit means consists of m inputs, each of said m inputs of said first group of inputs of said logic circuit means being connected to a discrete one of said m inputs of said m storage means, and wherein said second group of inputs of said logic circuit means consists of m inputs, each of said m inputs of said second group of inputs of said logic circuit means being connected to a predetermined one of said second (L2) latch circuits of said m stage shift register.

9. An integrated circuit containing an m×n read/write memory array, as recited in claim 8, wherein said control circuitry for shifting said predetermined bit pattern into and out of said m stage shift register includes scan circuit means adapted to receive an A-clock signal and a B-clock signal.

10. An integrated circuit containing an m×n read/write memory array, as recited in claim 9, wherein said word data port and said redundant word data port of each of said first (L1) latch circuits of said m shift register latch circuits is adaped to receive a system clock.

11. An integrated circuit containing an m×n read/write memory array, wherein m×n are respectively positive integers and said memory array having the capacity to store m words, each of said words having n bits, said array including;

m storage means, each said m storage means having an input and an output, each of said m storage means having the capacity to store a word having n binary bits, at least one predetermined one of said m storage means being defective;

m memory array inputs each of said m memory array inputs corresponding to one of said m storage means and connected to the input thereof;

at least one redundant storage means, said redundant storage means having an input and an output, said redundant storage means having the capacity to store a word having n binary bits;

m memory array outputs, each of said m memory array outputs corresponding to one of said m storage means;

level sensitive scan design circuit means connected to said outputs of said m storage means, said output of said at least one redundant storage means and said m memory array outputs, said level sensitive scan design circuit means including means for storing a predetermined binary bit pattern, said predetermined bit pattern identifying the predetermined defective one of said m storage means;

logic circuit means having a first group of inputs, a second group of inputs and an output, said first group of inputs being selectively connected to said m inputs of said m storage means, said second group of inputs being selectively connected to said level sensitive scan design circuit means, said output of said logic circuit means being connected to said input of said redundant storage means, said logic circuit means being controlled by said predetermined binary bit pattern stored in said storage means of said level sensitive scan design circuit means, whereby said predetermined binary bit pattern is effective in causing the predetermined defective one of said m storage means to be replaced by said redundant storage means without any effect or modification on the function or designation of the m memory array inputs and m memory outputs; and, said integrated circuit containing an m × n read/write memory being further characterized as follows, wherein said level sensitive scan design circuit means includes m shift register latches, each of said m shift register latches being capable of storing at least one binary bit of data, said m shift register latches being utilized to store said predetermined bit pattern, wherein said m shift register latches of said level sensitive scan design circuit means are connected into an m stage shift register having a scan input, a scan output and control circuitry for shifting said predetermined bit pattern into and out of said shift register, wherein each of said m shift register latches includes interconnected first (L1) and second (L2) latch circuits and said predetermined binary bit pattern is stored in said m second (L2) latches of said m stage shift register, wherein each of said m first (L1) latch circuits includes a word data port and a redundant word data port and each of said m second (L2) latch circuits includes at least one data port, wherein each of said m first (L1) latch circuits has an output connected to a discrete one of said m memory array outputs, each of said m second (L2) latch circuits has a first output connected to said word data port of the first (L1) latch circuit contained within said same shift register latch as said second (L2) latch circuit, each of said m second (L2) latch circuits has a second output connected to said redundant word data port of the first (L1) latch circuit contained within said same shift register latch as said second (L2) latch circuit, wherein each of said outputs of said m storage means is connected to the word data port of a predetermined one of said first (L1) latch circuits of said m stage shift register, and wherein said output of said redundant storage means is connected in common to the redundant word data port of each of said first (L1) latch circuits of said m stage shift register, and wherein said first group of inputs of said logic circuit means includes m inputs, each of said m inputs of said first group of inputs of said logic circuit means connected to a discrete one of said m inputs of said m storage means, and wherein said second group of inputs of said logic circuit means includes m inputs, each of said m inputs of said second group of inputs of said logic circuit means being connected to a predetermined one of said second (L2) latch circuits of said m stage shift register.

12. In an integrated circuit chip, said integrated circuit chip including:

a read/write memory array, said memory array including at least four storage means, each of said storage means having the capacity to store n binary bits of data, each of said four storage means having an input and an output;

a redundant storage means, said redundant storage means having an input and output, said redundant storage means having the capacity to store n binary bits of data;

at least four memory array inputs, each of said four memory array inputs corresponding to one of said four storage means;

at least four memory array outputs, each of said four memory array outputs corresponding to one of said four storage means;

at least four receiver circuits, each of said receiver circuits connected between a discrete one of said memory array inputs and the input of a discrete one of said storage means;

at least four shift register latch circuits (SRL), each of said shift register latch circuits being connected to the output of a discrete one of said storage means, each of said shift register latch circuits also connected to the output of the redundant storage means;

at least four driver circuits, each of said driver circuits having an input connected to a discrete one of said shift register latch circuits and an output connected to a discrete one of said memory array outputs, logic circuit means having a first group of inputs, a second group of inputs and an output, each input of said first group of inputs connected to a discrete one of said receiver circuits, said output of said logic circuit means connected to said input of said redundant storage means; and, said integrated circuit chip being further characterized as follows, each of said shift register latch circuits having interconnected first (L1) and second (L2) latch circuits, said first (L1) latch circuit of each of said shift register latch circuits having a word data port connected to the associated storage means and a redundant word data port connected to the output of said redundant storage means, said second (L2) latch circuit of each of said shift register latch circuits having an output connected to an input of said second group of inputs of said logic circuit, and scan-in scan-out circuit means for scanning a binary pattern into said register latches, whereby as directed by said binary pattern said redundant storage means will functionally replace any predetermined one of said four storage means without any effect or modification on the function or designation of the m memory array inputs and m memory array outputs.

* * * * *